United States Patent [19]

Legge et al.

[11] Patent Number: 4,555,303

[45] Date of Patent: Nov. 26, 1985

[54] OXIDATION OF MATERIAL IN HIGH PRESSURE OXYGEN PLASMA

[75] Inventors: Ronald Legge, Scottsdale; M. John Rice, Jr., Tempe; Kalluri R. Sarma, Mesa, all of Ariz.

[73] Assignee: Motorola, Inc., Schaumburg, Ill.

[21] Appl. No.: 656,822

[22] Filed: Oct. 2, 1984

[51] Int. Cl.$^4$ .................. B44C 1/22; C03C 15/00; C03C 25/06

[52] U.S. Cl. .................. 156/643; 134/2; 156/646; 156/655; 427/39; 427/86

[58] Field of Search .................. 427/38, 39, 86, 227; 264/81, 82; 156/643, 646, 655; 134/2

[56] References Cited

U.S. PATENT DOCUMENTS 3,425,878  2/1969  Dersin et al. .................. 156/662 X
4,370,288  1/1983  Rice et al. .................. 264/81

*Primary Examiner*—William A. Powell
*Attorney, Agent, or Firm*—John A. Fisher

[57] ABSTRACT

A process is disclosed for removing carbonaceous material from a surface in a high pressure oxygen plasma. A surface, such as a surface of a silicon ribbon, having a layer of carbonaceous material thereon is positioned in a high pressure plasma reaction volume. A high pressure rf plasma is generated in which the plasma includes reactive and ionic oxygen species. The reactive oxygen species are directed to and react with the layer of carbonaceous material to oxidize that material. The reaction products of the oxidation step include carbon dioxide and, possibly a non-oxidizing ash material which can easily be removed from the silicon surface.

15 Claims, 3 Drawing Figures

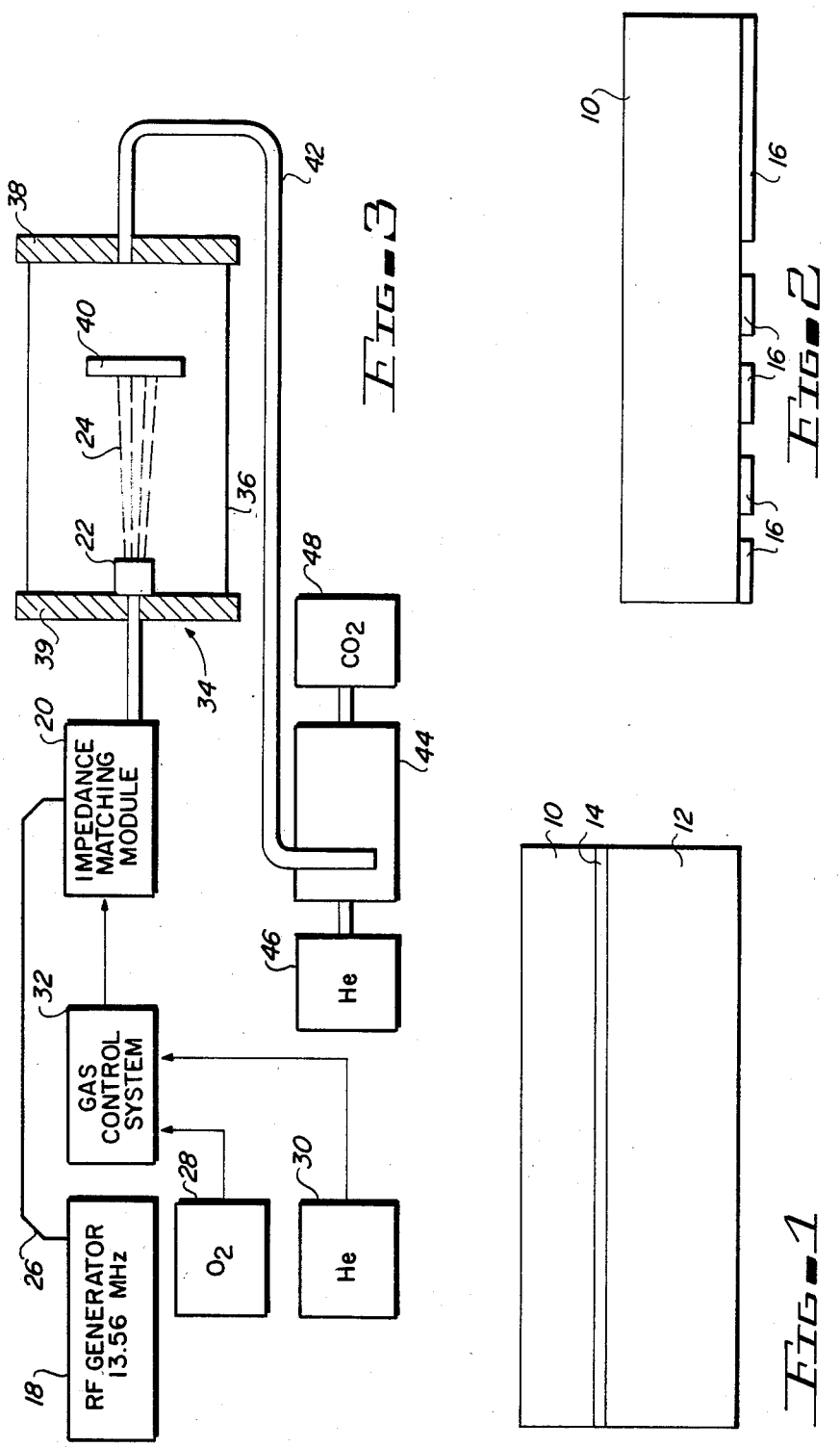

OXIDATION OF MATERIAL IN HIGH PRESSURE OXYGEN PLASMA

BACKGROUND OF THE INVENTION

This invention relates generally to the high pressure plasma oxidation of oxidizable layers, and more specifically to the oxidative removal of carbonaceous release layers in a high pressure oxygen plasma.

In the manufacture of many types of devices, the manufacturing process requires the removal of one material from the surface of a second material without deleteriously affecting the surface of that second material. Where one material is readily oxidizable and the other is not, that one material can sometimes be removed by oxidation. For example, in the manufacture of semiconductor devices, photoresist layers are often removed from the surface of a silicon wafer by oxidizing or "ashing" the photoresist material in an oxygen plasma. The plasma oxidation is done at a reduced pressure under conditions similar to those used for plasma etching and plasma deposition.

In a further example, as in the process for manufacturing polycrystalline silicon ribbons such as the process described in U.S. Pat. No. 4,370,288, polycrystalline silicon material is deposited onto a temporary refractory material substrate which is coated with a release layer of graphite. The silicon is separated from the temporary substrate, with the help of the release layer, by thermal expansion shear separation. During the process, however, a portion of the graphite release layer adheres to the silicon material and must be subsequently removed. The graphite material can be removed by sand blasting followed by chemical etching to remove the abrasive particulate contamination, but this process consumes large amounts of expensive abrasive material, requires a considerable amount of equipment maintenance, and is not a clean, contaminant free operation. The graphite layer can also be removed by thermal oxidation, for example, by subjecting the graphite material on the silicon to an oxidizing ambient for about 2 hours at a temperature in excess of 900° C. This process is time-consuming, expensive, and requires that the silicon material be exposed to deleterious high temperatures for long periods of time. The large amount of graphite material can be removed by low pressure plasma oxidation only by extremely long exposures.

Similarly, other manufacturing operations using the same or similar materials require the removal of a first material from a second dissimilar material. In many of these operations the workpiece cannot he exposed to high temperatures for long periods of time to accomplish the removal. A need therefore existed for a process for such removal which would overcome the problem associated with the prior art processes.

It is therefore an object of this invention to provide an improved process for the oxidative removal of a material from the surface of a second, dissimilar material.

It is another object of this invention to provide an improved process for the high pressure plasma oxidative removal of carbonaceous material from the surface of another material.

It is yet another object of this invention to provide an improved process for the oxidative removal of a carbonaceous release material from a silicon ribbon.

It is a further object of this invention to provide an improved process for producing silicon ribbon.

It is a still further object of this invention to provide a low temperature process for the removal of an oxidizable layer from a dissimilar substrate.

BRIEF SUMMARY OF THE INVENTION

The foregoing and other objects of the invention are achieved through the use of a high pressure rf plasma oxidation process. Graphite or other oxidizable material is removed from a surface by positioning the surface with oxidizable material thereon in the reaction volume of a high pressure rf plasma apparatus. A high pressure rf oxygen plasma is generated to produce reactive oxygen species. The reactive oxygen species are directed to and react with the oxidizable material, thereby removing the material from the surface. The reaction products include carbon dioxide and possibly an ash of nonoxidizable material which can be easily removed from the surface.

BRIEF DESCRIPTION OF THE DRAWINGS

FIGS. 1 and 2 illustrate one structure to which the process in accordance with the invention can be applied; and FIG. 3 illustrates apparatus for practice of the invention.

DETAILED DESCRIPTION OF PREFERRED EMBODIMENTS

The process in accordance with the invention is applicable to the oxidation of a variety of materials in a variety of different applications. The process can be applied in any application in which the material to be removed can be oxidized to form a volatile reaction product. For purposes of illustration, the invention will be described by reference to one specific application of the invention; it is not intended, however, that the invention be limited to this single illustrative embodiment.

FIGS. 1 and 2 illustrate one structure to which the process in accordance with the invention can be applied. FIG. 1 illustrates, in cross-section, a portion of a polycrystalline ribbon 10 which has been deposited upon a temporary refractory substrate 12. The polycrystalline silicon layer is deposited, for example, by chemical vapor deposition. Trichlorosilane and hydrogen, for example, are reacted at an elevated temperature to deposit the polycrystalline silicon on heated substrate 12. The substrate can be, for example, graphite, molybdenum, or other refractory material as more fully described in U.S. Pat. No. 4,370,288. When the polycrystalline silicon and substrate are cooled from the deposition temperature, the silicon is separated from the substrate by thermal expansion shear separation (TESS) as a result of the difference in the thermal expansion coefficients of the silicon and substrate. To facilitate the TESS process a release layer 14 is provided on the surface of the refractory substrate 12. The release layer can be, for example, finely divided graphite particles. Upon cooling from the deposition temperature, the silicon separates from the substrate at the release layer 14.

As illustrated in FIG. 2, a portion 16 of release layer 14 adheres to the surface of polycrystalline silicon 10 after the shear separation. In accordance with the invention, as more fully explained herein below, the adherent graphite material is removed from the surface of the silicon by oxidizing the graphite in a high pressure rf oxygen plasma.

A plasma can be defined as an approximately neutral cloud of charged particles. The plasma may be formed, for example, by an electric glow discharge in a strong electric field. The types and characteristics can vary widely; two types commonly of interest are the low pressure and high pressure plasmas. The boundary line which distin8uishes between the two types of Plasma is a pressure of about 13.3 KPa (100 Torr), but for practical purposes the high-pressure plasma (HPP) is typically produced at a pressure of about 1 atmosphere (100 KPa). An important distinction between low pressure and high pressure plasma relates to temperature: in a low pressure plasma the electron temperature can be much greater than the gas temperature; in contrast, the conditions found in a high pressure plasma lead to thermal equilibrium in which the electron and gas temperatures are nearly identical. The gas temperature in the high pressure plasma can typically reach 3,000°–5,000° K.

FIG. 3 illustrates an apparatus suitable for practice of the invention. This and similar apparatus are more fully described in U.S. Pat. No. 4,309,259, the content of which is hereby incorporated by reference. The apparatus includes a high frequency rf generator 18, an impedance matching module 20, and a nozzle 22 for sustaining a high pressure rf plasma beam 24. While the exact frequency of the generator is not critical to the invention, a frequency of 13.56 MHz is preferred in accordance with FCC regulations. A coaxial cable 26 connects the rf generator to the impedance matching module.

Reactant gases 28, 30 such as oxygen and helium, respectively, are conveyed to a gas control system 32 and from there to the impedance matching module and the plasma nozzle 22.

The plasma is generated in a plasma reaction volume 34 which is bounded, for example, by a quartz sleeve 36 and end caps 38, 39. Work piece 40, to be operated on by the high pressure plasma beam 24, is positioned within the reaction volume. Gaseous reaction products are conveyed from the reaction volume through an exhaust 42, to an effluent collection apparatus 44 from which certain reaction products such as helium 46 are recovered and carbon dioxide 48 is exhausted.

In accordance with the invention, oxidizable material such as the adherent graphite residue 16 is removed by high pressure rf plasma oxidation of the graphite material. Silicon ribbon 10, with the adherent graphite residue 16, is placed in the reaction volume. The high pressure oxygen plasma is generated in a manner similar to that described in U.S. Pat.No. 4,309,259. The high pressure plasma is directed at the graphite residue where the highly reactive oxygen atoms and oxygen free radicals react with the graphite according to the overall chemical reaction:

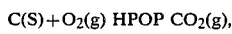

$C(S) + O_2(g) \xrightarrow{HPOP} CO_2(g)$, where HPOP represents "high pressure oxygen plasma".

The HPOP system used in this process is similar to the HPP system described in U.S. Pat. 4,309,259 with minor modifications to the plasma nozzle. First, the nozzle and the related reactant conveyance system are replaced by a more simple, single flow nozzle instead of the dual flow nozzle therein described. Second, the nozzle electrode material is replaced by a material which can withstand the highly oxidizing ambient of HPOP. The nozzle material can be, for example, nickel, or an oxidation resistant material such as nickel or tin oxide on a highly conductive (thermal and electrical) material such as copper.

The following non limiting examples serve to further explain the invention and to disclose best modes contemplated by the inventors for practice of the invention.

EXAMPLE I

Polycrystalline silicon samples having a surface area of two centimeters by 4 centimeters and having a graphite release layer adherent to them were placed in the reaction volume of high pressure rf plasma reactor. The rf plasma power was adjusted in the range of 500–800 watts. Oxygen diluted with helium was fed to the plasma nozzle and a high pressure rf plasma was generated at a pressure of about one atmosphere. Gas flow rates were adjusted so that the total flow included up to 32% oxygen with the balance being helium. The oxygen plasma was directed onto the silicon surface for 2–4 minutes. The sample temperatures (due to plasma beam heating) were estimated to be in the range of 600°–700° C. The graphite layer was completely oxidized, leaving behind a powdery ash on the surface of the silicon. The ash, which resulted from nonoxidizing impurities in the release layer material, was removed in an aqueous solution of sodium hydroxide in water to leave a clean, contaminant-free polycrystalline silicon surface.

EXAMPLE II

To test the reaction rate and reaction efficiency of the process in accordance with the invention, a graphite sample having dimensions of 2 centimeters by 4 centimeters by 0.635 centimeter was oxidized in a high pressure rf oxygen plasma at 700 watts, 1.86 liters per minute $O_2$ and 4.0 liters per minute of helium. All of the graphite was oxidized within about 15 minutes. This indicates a graphite removal rate of about 0.0423 centimeter per minute and a reaction efficiency (oxygen utilization) of about 78%. Mass spectroscopic analysis of the reaction effluent gases indicated that the carbon oxidizes essentially to carbon dioxide in the HPOP.

The helium used as a diluent in the HPOP process can be reclaimed (after separating $CO_2$ from it) and reused. The helium and $CO_2$ can be economically separated, for example, by gas chromotography.

The oxidation process was carried out with reactant mixtures containing as much as about 32% by volume of oxygen. At lower oxygen concentrations the reaction slowed and more helium had to be recycled. At higher oxygen concentrations problems were encountered with oxidation of the plasma nozzle. Also, with the particular equipment used, it was difficult to maintain the proper impedance matching with oxygen concentration greater than about 32%.

Temperature of the workpiece can be controlled by adjusting the spacing between the plasma nozzle and the workpiece and thus adjusting the amount of plasma beam heating. Also, the workpiece temperature can be controlled by separate temperature controller (not shown in the Figures) which can either heat or cool the workpiece. It is preferred that the workpiece temperature be controlled at a low temperature (less than about 700° C.) to prevent or minimize deleterious heating effects.

Thus it is apparent that there has been provided, in accordance with the invention, a high pressure rf plasma oxidation process which fully meets the objects and advantages set forth above. Although the invention has been described and illustrated with respect to specific embodiments thereof, it is not intended that the invention be limited to these illustrative embodiments. Those skilled in the art, after reviewing the foregoing detailed description, will recognize variations and modifications differing from the illustrative embodiment. The oxidation process may be applied, for example, to other materials and in other high pressure rf plasma apparatus. Additionally, other oxygen bearing gases and other diluents may be employed other than pure oxygen and helium, respectively. Accordingly, it is intended to include all such variations and modifications as fall within the spirit and scope of the appended claims.

We claim:

1. A process for removing graphite from a surface which comprises the steps of: providing a surface having a layer of graphite adherent thereto; positioning said surface and said layer of graphite in a reaction volume; generating a high pressure rf plasma comprising reactive oxygen species; directing said reactive oxygen species to said layer of graphite; and oxidizing said layer of graphite.

2. The process of claim 1 wherein reactants for said high pressure rf plasma comprise oxygen and a diluent.

3. The process of claim 2 wherein said diluent comprises helium.

4. The process of claim 2 further comprising the steps of collecting gaseous effluent including reaction products from said step of oxidizing; and recovering said diluent irom said effluent.

5. The process of claim 1 wherein nonoxidizable contaminants in said graphite leave an ash residue on said surface, said process further comprising reacting said ash with a solution NaOH.

6. A process for oxidative removal of carbonaceous material which comprises the steps of: providing a surface having carbonaceous material thereon; generating a high pressure rf plasma; introducing oxygen to said plasma to produce reactive oxygen species; contacting said carbonaceous material with said reactive oxygen species to cause oxidation of said carbonaceous material; and continuing said contacting until substantially all of said carbonaceous material is oxidized.

7. The process of claim 6 wherein said carbonaceous material comprises photoresist.

8. The process of claim 6 wherein said carbonaceous material comprises a graphite release layer.

9. The process of claim 6 further comprising the step of controlling the temperature of said surface during said step of contacting.

10. A process for producing silicon ribbon comprising the steps of: providing a deposition substrate having a release layer comprising graphite thereon; depositing silicon on said substrate; separating said silicon from said substrate, whereby a portion of said release layer is adherent to said silicon; providing a high pressure rf plasma generating apparatus including a reaction volume; positioning said silicon and said portion of release layer in said reaction volume; generating a high pressure rf plasma including reactive oxygen species in said reaction volume; and reacting said oxygen species with said portion of release layer to oxidatively remove said portion of release layer.

11. The process of claim 10 further comprising the step of removing from said silicon ash formed during said reacting.

12. The process of claim 10 further comprising employing a diluent gas in generating said high pressure rf plasma.

13. The process of claim 12 further comprising the step of collecting effluent from said step of reacting.

14. The process of claim 13 further comprising the step of separating and recovering said diluent gas from said effluent.

15. The process of claim 12 wherein said diluent gas comprises helium.

* * * * *